(12) United States Patent
Yeoh

(10) Patent No.: US 6,979,646 B2
(45) Date of Patent: Dec. 27, 2005

(54) HARDENING OF COPPER TO IMPROVE COPPER CMP PERFORMANCE

(75) Inventor: Andrew Yeoh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,215

(22) Filed: Dec. 29, 2000

(65) Prior Publication Data

US 2002/0084527 A1  Jul. 4, 2002

(51) Int. Cl.$^7$ .................... H01L 21/44; H01L 21/4763
(52) U.S. Cl. .................. 438/687; 438/549; 438/633
(58) Field of Search ................ 438/626, 631, 438/645, 633, 433, 440, 447, 449, 514, 542, 438/549, 687; 257/751–753, 758, 759, 761–768

(56) References Cited

U.S. PATENT DOCUMENTS

| | | | |
|---|---|---|---|
| 3,779,714 A | | 12/1973 | Nadkarni et al. |
| 4,749,548 A | * | 6/1988 | Akutsu et al. ............... 420/469 |
| 4,752,334 A | | 6/1988 | Nadkarni et al. |
| 6,022,808 A | * | 2/2000 | Nogami et al. ............. 438/694 |
| 6,117,770 A | * | 9/2000 | Pramanick et al. ......... 438/659 |
| 6,174,812 B1 | * | 1/2001 | Hsiung et al. .............. 438/687 |
| 6,181,012 B1 | | 1/2001 | Edelstein et al. |
| 6,352,920 B1 | | 3/2002 | Shimomura |
| 6,368,967 B1 | * | 4/2002 | Besser ........................ 438/687 |
| 6,432,819 B1 | | 8/2002 | Pavate et al. |
| 6,440,849 B1 | | 8/2002 | Merchant et al. |

* cited by examiner

Primary Examiner—Hung Vu
(74) Attorney, Agent, or Firm—Blakely, Sokoloff, Taylor & Zafman LLP

(57) ABSTRACT

A method for reducing the topography from CMP of metal layers during the semiconductor manufacturing process is described. Small amounts of solute are introduced into the conductive metal layer before polishing, resulting in a material with electrical conductivity and electromigration properties that are very similar or superior to that of the pure metal, while having hardness that is more closely matched to that of the surrounding oxide dielectric layers. This may allow for better control of the CMP process, with less dishing and oxide erosion a result. A secondary benefit of this invention may be the elimination of superficial damage and embedded particles in the conductive layers caused by the abrasive particles in the slurries.

3 Claims, 5 Drawing Sheets (Prior Art)

(Prior Art)

Figure 3A
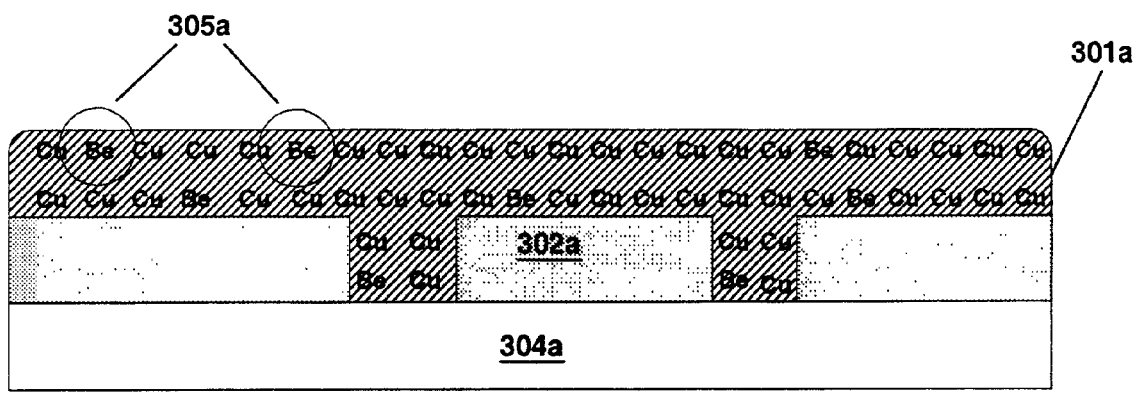
Heat
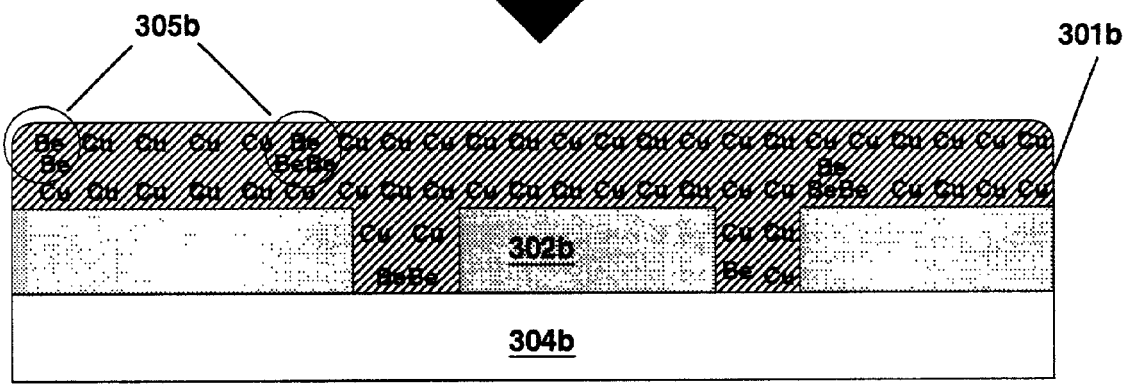
Figure 3B

Figure 4A
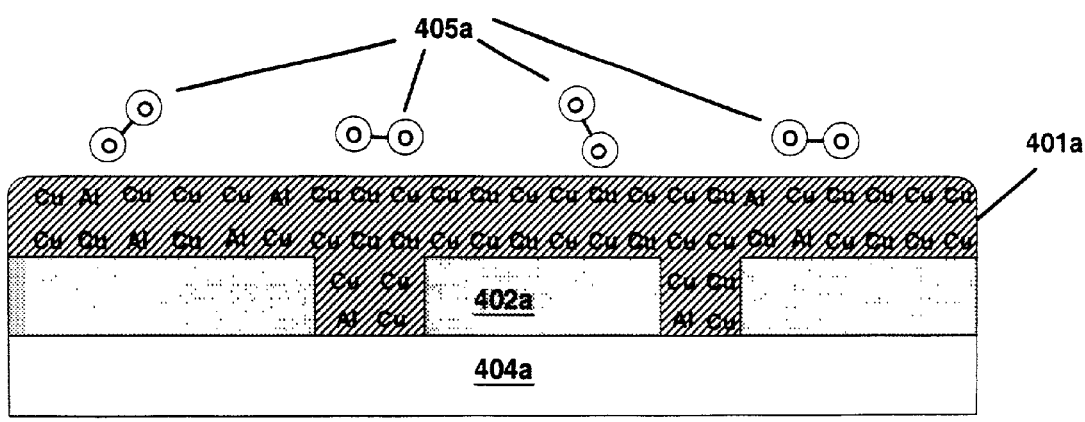
Heat
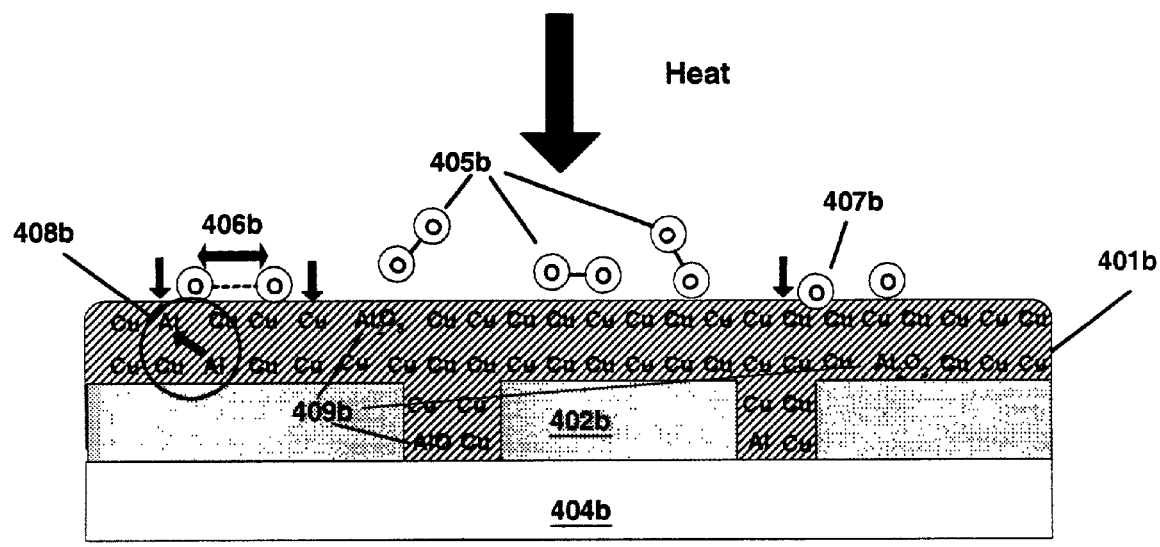
Figure 4B (Prior Art)

HARDENING OF COPPER TO IMPROVE COPPER CMP PERFORMANCE

BACKGROUND OF THE INVENTION

1. Field of the Invention

This invention relates to semiconductor processing technology generally, and more specifically, to chemical mechanical polishing technology for planarization of deposited materials.

2. Description of the Related Art

The manufacture of an integrated circuit device requires the formation of various layers (both conductive and non-conductive) above a base substrate to form the necessary components and interconnects. During the manufacturing process, certain layers or portions of layers must be removed to form the components and interconnects. Generally, the removal is achieved chemically (etching), or chemically and mechanically (chemical mechanical polishing).

FIG. 1 is a simplified cross-sectional schematic of a semiconductor wafer, consisting of a dielectric layer 102 on top of a silicon wafer 104. Trenches are formed in the dielectric 102, using masking and etching techniques well known in the art. The dielectric 102 has a metal layer 101 deposited on top using techniques such as Physical Vapor Deposition (PVD), Chemical Vapor Deposition (CVD) or electroplating. Copper is used in the metallic layer because of its inherent higher conductivity and improved resistance against electromigration, versus the prior art aluminum. The deposited metal fills the previously created trenches 103. The metal above the plane of the dielectric must be removed before subsequent steps in the device manufacturing process can be performed.

One method of removing the excess metal is through CMP as illustrated in FIG. 1. A slurry 105 containing abrasive particles (not shown) is introduced into a polishing device containing a polishing pad. The mechanical movement of the pad and abrasive particles relative to the wafer, combined with the chemical reaction of the slurry with the copper surface 107, provides the means for removing the exposed, oxidized surface of the copper layer 107. The chemical nature of the slurry used, along with that of the particles, depends on the type of material to be removed.

FIG. 2 illustrates the wafer of FIG. 1 after polishing. CMP of metals can be used to define vertical and horizontal wiring 203 in semiconductor wafers, such as a silicon wafer. This process requires high selectivity in removal rate of metals 203 versus dielectric surfaces 202, such as a silicon dioxide layer, to avoid both oxide erosion 206 on patterned structures and copper "dishing" 205, where dishing is defined as selective localized removal of the copper versus that of the surrounding oxide dielectric 202. This localized removal occurs because of differing hardness between the oxide dielectric 202 and the softer copper 203, and because the slurry is generally selected to preferentially remove the copper over the dielectric. Oxide erosion is also a result of the aforementioned reasons; in this case, however, narrow oxide features are less resistant to the induced abrasive forces than the wider oxide features because of the "dishing" of copper lines on either side of the oxide.

There are a number of ways of improving selectivity toward metals. Process parameters that are varied to improve selectivity toward metals versus dielectrics include reducing the polish pressure, optimizing the rotational and orbital speed of the polishing device, selecting the proper slurry chemistry, polish pad material, and polish pad groove geometry. However, all of these methods address the polishing side of the problem, rather than the material-choice issue for interlayer connects.

An alternative to changing processing parameters is to change the nature of the material polished. A problem associated with CMP of copper layers in semiconductors is related to the inherent softness of copper. If the copper could be hardened with little or no change in electrical or electromigration properties, process selectivity adjustments may be reduced or eliminated, thus improving process robustness and semiconductor device quality.

What is needed is an interlayer connect material for semiconductor devices that is harder than that used in the current art, allowing the use of the present polishing materials and methods, but resulting in better control of oxide erosion and dishing. This material should maintain close to the same conductivity and electromigration advantages associated with copper.

BRIEF DESCRIPTION OF THE DRAWINGS

The present invention is illustrated by way of example, and not limitation, in the Figures of the accompanying drawings in which:

FIG. 3a shows a side view of an embodiment of a metal hardening process using solid solution hardening.

FIG. 3b shows an embodiment of a metal hardening process using precipitation hardening.

FIG. 4a illustrates the deposition of oxygen from an ambient source on a copper matrix with an aluminum solute.

FIG. 4b illustrates the formation of an oxide dispersion-hardened metal layer by heating the metal film deposited in FIG. 4a.

DETAILED DESCRIPTION OF THE INVENTION

Figure 1:
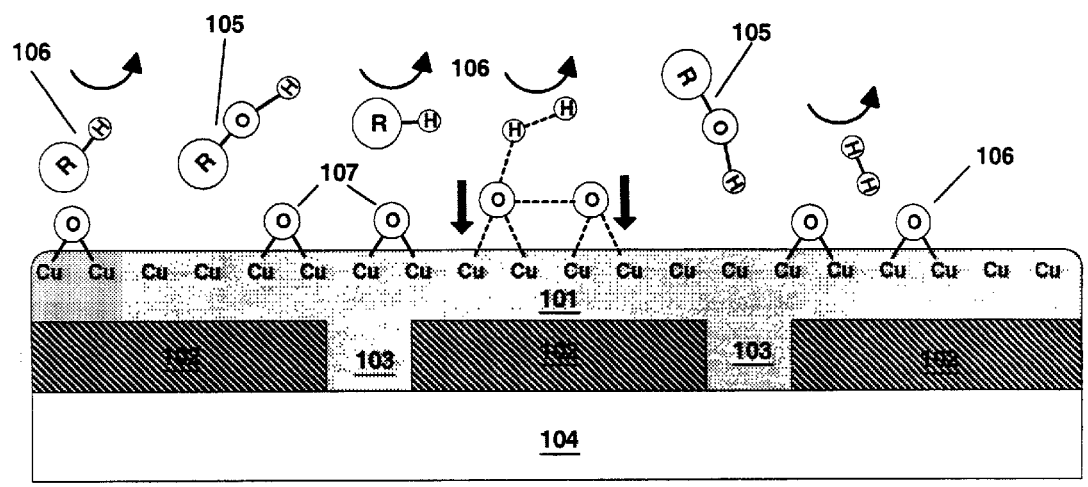
FIG. 1 shows a prior art CMP polishing process.
Figure 2:
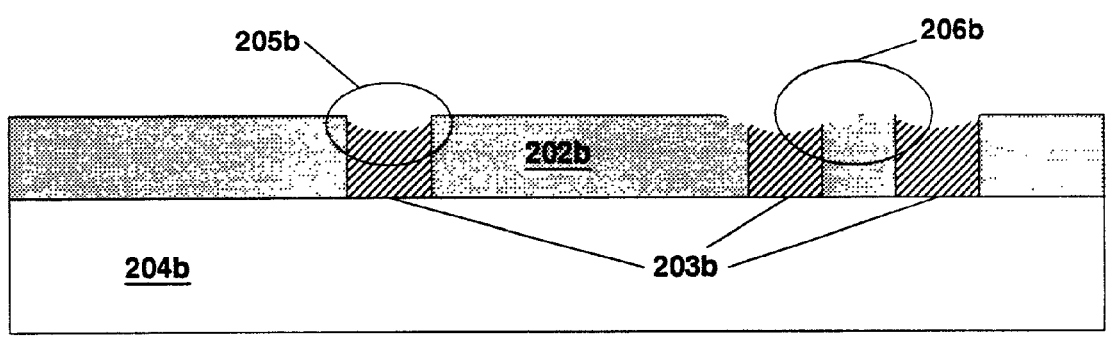
FIG. 2 illustrates dishing and dielectric over-etch associated with the prior art CMP polishing process.

A method for improving the performance of the chemical-mechanical polishing (CMP) process used in polishing semiconductor interconnect layers is described. In the following description, numerous specific details are set forth such as material types, dimensions, etc., in order to provide a thorough understanding of the present invention. However, it will be obvious to one of skill in the art that the invention may be practiced without these specific details. In other instances, well-known elements and processing techniques have not been shown in particular detail in order to avoid unnecessarily obscuring the present invention.

A method for reducing the topography from CMP of metal layers during the semiconductor manufacturing process is described. Small amounts of solute are introduced into the conductive metal layer before polishing, resulting in a material with electrical conductivity and electromigration properties that are very similar or superior to that of the pure metal, while having hardness that is more closely matched to that of the surrounding oxide dielectric layers. This may allow for better control of the CMP process, with less copper dishing and oxide erosion as a result. A secondary benefit of this invention may be the elimination of superficial damage and embedded particles in the conductive layers caused by the abrasive particles in the slurries.

This discussion will mainly be limited to those needs associated with improving CMP performance on copper layers deposited on silicon dioxide dielectric layers. It will be recognized, however, that such focus is for descriptive purposes only and that the apparatus and methods of the present invention are applicable to other types of materials that may be used in constructing semiconductor devices.

A number of copper hardening methods are known in the art, but these are typically used for bulk copper materials rather than the thin films used in semiconductor processing. One method currently practiced for bulk copper is solid solution hardening. In this method, a small amount (typically between 0.01–5.0%) of another metallic species (also referred to as a solute) is introduced into the copper matrix. The solute atoms may take the place of the copper atoms in the normal copper matrix, or occupy interstitial sites in the crystal lattice. The solute atoms may "pin" dislocations and vacancies within the matrix, thus preventing slippage between the various atomic planes of the metal, resulting in improved mechanical properties (i.e. hardness and strength). Typical solutes used with copper solid solution strengthening are beryllium, silver, aluminum, zinc, zirconium, and chromium. Note that this list is not exhaustive and the elements listed can be used singly (i.e. binary system) or in various combinations (i.e. ternary, quarternary, and higher systems) depending on the material property that is to be enhanced.

FIGS. 3a and 3b show a cross-sectional view of a wafer to illustrate an embodiment of the current invention. In this embodiment, a layer of copper 301a is deposited over a layer of silicon dioxide material 302a, which is used in a semiconductor device as a dielectric. In one embodiment, the thickness of the copper may be 5000 Angstroms. The dielectric has had vias or contacts 303a etched through it, to allow for the interconnection of the various layers of the device. Rather than using pure copper, as would be done under the current art, a small amount of a solute metal 305a is introduced during the deposition. The amount of solute used may be in the range of 0.01–5.0 atomic percent. Note, however, that the amount of solute used may differ substantially from this amount, and will depend on the matrix/solute system being used. Therefore, the above amounts are for illustration only, and should not necessarily be construed as limiting. The deposition methods used may include many used in the current art. Examples include CVD, PVD, or electroplating, as discussed in the Background. The solute will be co-deposited along with the matrix metal. The solute 305a in this embodiment is beryllium; however, in another embodiment, either using copper or another matrix material, the solute species may be some other species, such as magnesium or other appropriate element.

A second hardening method, precipitation hardening, is related to the above solid solution method. In this method solute atoms are introduced during deposition of the copper matrix, as was described above. Generally, precipitation strengthened metals involve higher solute percentages compared to solid solution strengthening, 0.1–10% depending on the matrix/solute phase. In this case, however, the material is heated to allow increased solution of the solute phase into the matrix. When the heated metal is cooled, the increased solute phase, which is unstable at ambient temperatures, precipitates out as a finely dispersed solute-rich phase, which can sometimes be an intermetallic compound (e.g. CuBex). The precipitates impart higher yield strength to the metal by hindering dislocation motions in the metal lattice, resulting in a stronger and harder material. Beryllium and aluminum are two examples of possible solute species.

Thus, in another embodiment of the present invention, the matrix metal layer with the included solute atoms (beryllium, in this embodiment) 301a is deposited as in the embodiment shown in FIG. 3a. Once the deposition is completed, however, the wafer is subjected to another heating step, as shown in FIG. 3b. This "aging" heat treatment drives further solute diffusion and consolidation to form "islands" 305b of beryllium-rich precipitates with a relatively large grain size. This approach, while yielding a harder material than "pure" copper, leads to a softer material than the embodiment discussed previously. One possible advantage of this method is that it would allow for a range of hardnesses to be achieved, thus allowing for more precise matching of metal hardness with that of the dielectric.

A third hardening technique often used in the art is oxide dispersion hardening. One method is to introduce a solute into the copper matrix, as discussed in FIG. 3 above. The solute is then oxidized, either by an internal oxidant, such as an oxidized analog of the matrix material (i.e., a copper oxide for copper matrices), or by using an external source, such as an ambient oxygen supply. The solute is chosen so that it will preferentially oxidize over the matrix material. A typical solute used is aluminum. Typical concentrations for solutes range from about 0.01% to 5.0% by weight solute metal.

FIG. 4 illustrates an embodiment of the invention using the oxide dispersion-strengthening technique. In this embodiment, a layer of copper containing a small percentage (for example, 0.01 to 5.0% by weight) of aluminum atoms is deposited on top of the dielectric 402a and/or silicon wafer 404a surface. The wafer containing the deposited film is then heated in an oxygen-containing atmosphere. The oxygen migrates 407b into the metal matrix 401b. The oxygen 407b preferentially oxidizes the included aluminum atoms. This leads to the formation of dispersed aluminum oxide species 409b, which act as dislocation barriers to slippage between the planes of the matrix. This results in a stronger and, more importantly, harder material, with a possible electrical conductivity approaching 90% that of pure copper metal. Note that while aluminum is used for the above illustration, any solute with an appropriately high negative energy of oxide formation (versus that of the matrix metal) could be used. In general, the solute metal should have a free energy of oxide formation at least 60 kilocalories per gram of oxygen greater than that of the matrix metal. Examples of appropriate solute metals may include beryllium, magnesium, or thorium.

Figure 5:
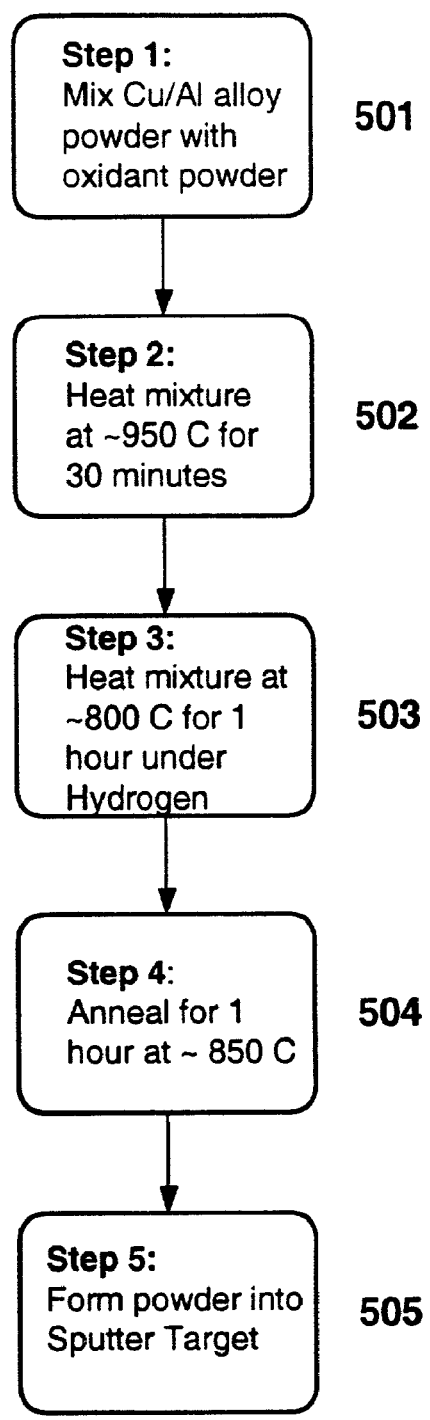
FIG. 5 illustrates the process used to form an oxide dispersion-hardened sputtering target using a prior art powder metallurgy method.

In a fourth embodiment, a sputtering target, used for PVD of metal layers in the semiconductor manufacturing process, can be manufactured from powder metallurgy methods known in the art to form an oxide dispersion-hardened copper, similar to that discussed in FIG. 4 above. In this embodiment, however, the oxidant would be internal, using a mixture of copper oxide (also referred to as the matrix metal oxide) and aluminum oxide (also referred to as the refractory metal oxide) for a copper target with an aluminum solute. FIG. 5 illustrates a typical prior art processes flow for manufacturing oxide dispersion-strengthened metal powders. Copper oxide is heat reducible. By heating a mixture of metal alloy (a copper-aluminum alloy, for instance), matrix metal oxide, refractory metal oxide and solute 501 at approximately 950 C for approximately 30 minutes 502, a metal matrix with internally oxidized solutes is formed. In this case, as in FIG. 4 above, the oxidized solute formed is aluminum oxide. Some unreacted copper oxide may remain in the powder following the oxidation step. A reduction step, at approximately 800 C under hydrogen gas for approximately one hour 503, may be needed to reduce any unreacted copper oxide to the metallic state. Finally, the oxidized and reduced metal powder is annealed, in either an inert atmosphere or under vacuum, at approximately 850 C for about one hour 504. This oxide dispersion-strengthened powder can then be formed into a sputtering target 505 using methods known in the art. The target may then be used to sputter a dispersion-hardened material directly onto the dielectric layer, eliminating the need for the elevated-temperature oxidation step outlined in FIG. 4 above. This may result in a faster, less expensive process for the production of dispersion-hardened contact materials. As discussed above in FIG. 4, while aluminum was used as an example of an appropriate solute for description of this embodiment, other solute metals with adequately negative free energies of oxide formation, such as beryllium, magnesium, or thorium may be appropriate to use in the embodiment described in FIG. 5.

Thus, what has been described is a method for improving chemical mechanical polishing of copper layers in semiconductor devices. Application of the inventions described may significantly reduce unwanted metal loss incurred during CMP. In addition, copper CMP process conditions may be made less stringent which may allow potential materiel and energy savings through reduced usage of consumables (polish pads, slurry, water, etc.)

In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method for forming hardened interconnects comprising:
   depositing a metal film over a semiconductor wafer surface;
   introducing an additional metal species comprising beryllium to the metal film;
   heating the deposited metal film with the introduced metal species;
   allowing the metal film to cool, so as to form precipitates of the introduced metal species; and
   after allowing said heated metal film to cool performing chemical-mechanical polishing wherein the additional metal precipitates harden said deposited metal film to reduce the rate of said polishing.

2. The method of claim 1, wherein the deposited metal film is copper.

3. The method of claim 1, further comprising introducing a solute selected from the group consisting of silver, aluminum, zinc, zirconium, chromium, and magnesium before heating the deposited metal film with the introduced metal species.

* * * * *